(12) United States Patent
Liu et al.

(10) Patent No.: US 10,818,627 B2
(45) Date of Patent: Oct. 27, 2020

(54) ELECTRONIC COMPONENT INCLUDING A CONDUCTIVE PILLAR AND METHOD OF MANUFACTURING THE SAME

(71) Applicant: Advanced Semiconductor Engineering, Inc., Kaohsiung (TW)

(72) Inventors: Wei-Wei Liu, Kaohsiung (TW); Huei-Siang Wong, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 111 days.

(21) Appl. No.: 15/690,143

(22) Filed: Aug. 29, 2017

(65) Prior Publication Data

US 2019/0067230 A1 Feb. 28, 2019

(51) Int. Cl.
*H01L 23/488* (2006.01)
*H01L 23/528* (2006.01)
(Continued)

(52) U.S. Cl.
CPC .......... *H01L 24/14* (2013.01); *H01L 23/3192* (2013.01); *H01L 24/05* (2013.01);
(Continued)

(58) Field of Classification Search
CPC ..... H01L 2924/014; H01L 2224/13147; H01L 2924/01029; H01L 23/49811; H01L 23/49827; H01L 24/06; H01L 24/16; H01L 24/17; H01L 24/81; H01L 24/94; H01L 2924/15311; H01L 2924/381; H01L 2924/3841; H01L 24/01; H01L 24/02; H01L 24/04; H01L 24/10; H01L 24/12; H01L 24/14; H01L 24/18; H01L 24/20; H01L 24/26; H01L 24/28; H01L 24/30; H01L 24/34; H01L 24/36; H01L 24/38; H01L 24/63; H01L 24/65; H01L 24/70; H01L 24/80–89; H01L 24/96;
(Continued)

(56) References Cited

U.S. PATENT DOCUMENTS

5,869,881 A * 2/1999 Lee ..................... H01L 29/1004
257/565
6,096,595 A * 8/2000 Huang .............. H01L 21/28518
257/E21.165
(Continued)

*Primary Examiner* — Maliheh Malek
(74) *Attorney, Agent, or Firm* — Foley & Lardner LLP (57) ABSTRACT

An electronic component includes a die, a first protective layer, a second protective layer, a first conductive pillar and a second conductive pillar. The die includes a conductive pad. The first protective layer is disposed on the die. The first protective layer defines a first opening to expose the conductive pad of the die. The second protective layer is disposed on the first protective layer. The second protective layer defines a second opening and a first recess. The second opening exposes the conductive pad of the die. The first conductive pillar is disposed within the second opening and electrically connected to the conductive pad. The second conductive pillar is disposed within the first recess. A height of the first conductive pillar is substantially equal to a height of the second conductive pillar. A bottom surface of the first recess is disposed between a top surface of the first protective layer and a top surface of the second protective layer.

11 Claims, 7 Drawing Sheets

(51) Int. Cl.
*H01L 23/31* (2006.01)
*H01L 23/00* (2006.01)
(52) U.S. Cl.
CPC ............... *H01L 24/06* (2013.01); *H01L 24/09* (2013.01); *H01L 24/13* (2013.01); *H01L 23/3114* (2013.01); *H01L 2224/05558* (2013.01); *H01L 2224/05562* (2013.01); *H01L 2224/05564* (2013.01); *H01L 2224/0603* (2013.01); *H01L 2224/06051* (2013.01); *H01L 2224/06102* (2013.01); *H01L 2224/13018* (2013.01); *H01L 2224/13083* (2013.01); *H01L 2224/13124* (2013.01); *H01L 2224/13147* (2013.01); *H01L 2224/13155* (2013.01); *H01L 2224/141* (2013.01); *H01L 2224/14517* (2013.01); *H01L 2924/01013* (2013.01); *H01L 2924/01028* (2013.01); *H01L 2924/01029* (2013.01); *H01L 2924/35* (2013.01); *H01L 2924/3511* (2013.01)

(58) Field of Classification Search
CPC ................. H01L 24/97; H01L 2224/02; H01L 2224/0212; H01L 2224/02123; H01L 2224/02125; H01L 2224/0213; H01L 2224/0214; H01L 2224/02141; H01L 2224/02145; H01L 2224/0215; H01L 2224/02163; H01L 2224/02165; H01L 2224/0217; H01L 2224/0218–0219; H01L 2224/03005; H01L 2224/03011; H01L 2224/03015

See application file for complete search history.

(56) References Cited

U.S. PATENT DOCUMENTS

| | | | | |
|---|---|---|---|---|
| 6,114,231 | A * | 9/2000 | Chen | H01L 24/02 438/612 |
| 6,218,302 | B1 * | 4/2001 | Braeckelmann | H01L 21/76807 438/687 |
| 7,019,407 | B2 * | 3/2006 | Chen | H01L 23/49816 257/737 |
| 7,977,783 | B1 * | 7/2011 | Park | H01L 24/11 257/692 |
| 8,022,544 | B2 * | 9/2011 | Lin | H01L 23/3114 257/758 |
| 8,129,267 | B2 * | 3/2012 | Cabral, Jr. | H01L 23/3192 257/640 |
| 8,304,867 | B2 * | 11/2012 | McCarthy | H01L 23/3114 257/669 |
| 8,405,213 | B2 * | 3/2013 | Chen | H01L 25/16 257/738 |
| 8,569,162 | B2 * | 10/2013 | Chien | H01L 24/11 438/613 |
| 8,710,657 | B2 * | 4/2014 | Park | H01L 23/3128 257/738 |
| 8,970,035 | B2 | 3/2015 | Lin et al. | |
| 9,219,016 | B2 * | 12/2015 | Lin | H01L 22/32 |
| 9,281,234 | B2 * | 3/2016 | Chen | H01L 21/76802 |
| 9,508,671 | B2 * | 11/2016 | Chiu | H01L 24/16 |
| 9,570,366 | B2 * | 2/2017 | Jeng | H01L 24/11 |
| 9,754,906 | B2 * | 9/2017 | Tsai | H01L 24/11 |
| 9,768,139 | B2 * | 9/2017 | Chiu | H01L 24/17 |
| 9,960,137 | B1 * | 5/2018 | Huang | H01L 24/16 |
| 10,008,462 | B2 * | 6/2018 | Seo | H01L 24/08 |
| 10,049,986 | B2 * | 8/2018 | Liu | H01L 21/762 |
| 10,181,448 | B2 * | 1/2019 | Hung | H01L 24/16 |
| 10,622,310 | B2 * | 4/2020 | Yang | H01L 23/15 |
| 2004/0266163 | A1 * | 12/2004 | Horng | H01L 24/11 438/614 |
| 2005/0017376 | A1 * | 1/2005 | Tsai | H01L 24/10 257/786 |
| 2006/0087034 | A1 * | 4/2006 | Huang | H01L 24/11 257/737 |
| 2006/0138671 | A1 * | 6/2006 | Watanabe | H01L 24/13 257/773 |
| 2006/0214293 | A1 * | 9/2006 | Park | H01L 23/3114 257/737 |
| 2006/0226542 | A1 * | 10/2006 | Chien | H01L 24/11 257/737 |
| 2007/0205520 | A1 * | 9/2007 | Chou | H01L 24/48 257/780 |
| 2008/0224326 | A1 * | 9/2008 | Kuo | H01L 23/3171 257/780 |
| 2008/0233731 | A1 * | 9/2008 | Lin | H01L 23/5223 438/597 |
| 2008/0308934 | A1 * | 12/2008 | Alvarado | H01L 24/05 257/738 |
| 2009/0283877 | A1 * | 11/2009 | Tsai | H01L 24/11 257/659 |
| 2010/0133705 | A1 * | 6/2010 | Fillion | H01L 21/76804 257/782 |
| 2011/0114986 | A1 * | 5/2011 | Kojima | H01L 33/405 257/99 |
| 2011/0198747 | A1 * | 8/2011 | Kuo | H01L 21/76898 257/737 |
| 2011/0204515 | A1 * | 8/2011 | Fazelpour | H01L 24/13 257/738 |
| 2011/0233585 | A1 * | 9/2011 | Kojima | H01L 33/486 257/98 |
| 2011/0272819 | A1 * | 11/2011 | Park | H01L 24/05 257/774 |
| 2012/0061823 | A1 * | 3/2012 | Wu | H01L 23/3157 257/737 |
| 2012/0104604 | A1 * | 5/2012 | McCarthy | H01L 24/05 257/738 |
| 2012/0126368 | A1 * | 5/2012 | Chan | H01L 23/5227 257/531 |
| 2012/0129333 | A1 * | 5/2012 | Yim | H01L 24/11 438/613 |
| 2012/0280385 | A1 * | 11/2012 | Tain | H01L 29/41766 257/737 |
| 2013/0032923 | A1 * | 2/2013 | Lin | H01L 23/5227 257/531 |
| 2013/0043583 | A1 * | 2/2013 | Wu | H01L 24/11 257/737 |
| 2013/0093077 | A1 * | 4/2013 | Liang | H01L 21/76841 257/737 |
| 2013/0127052 | A1 * | 5/2013 | Tu | H01L 23/3114 257/738 |
| 2013/0154108 | A1 * | 6/2013 | Lin | H01L 23/49816 257/774 |
| 2013/0249080 | A1 * | 9/2013 | Lin | H01L 24/20 257/737 |
| 2013/0256876 | A1 | 10/2013 | Lee et al. | |
| 2013/0264684 | A1 * | 10/2013 | Yu | H01L 21/561 257/616 |
| 2013/0299967 | A1 * | 11/2013 | Daniels | H01L 24/03 257/737 |
| 2014/0061897 | A1 * | 3/2014 | Lin | H01L 24/06 257/737 |
| 2014/0070396 | A1 * | 3/2014 | Kyozuka | H01L 24/24 257/698 |
| 2014/0077374 | A1 * | 3/2014 | Lin | H01L 23/481 257/741 |
| 2014/0167254 | A1 * | 6/2014 | Yu | H01L 24/11 257/737 |
| 2014/0319522 | A1 * | 10/2014 | Daubenspeck | H01L 24/13 257/48 |
| 2015/0004751 | A1 * | 1/2015 | Wu | H01L 23/3171 438/108 |
| 2015/0048499 | A1 * | 2/2015 | Tai | H01L 23/3192 257/737 |
| 2015/0108645 | A1 * | 4/2015 | Daubenspeck | H01L 23/522 257/751 |

(56) References Cited

U.S. PATENT DOCUMENTS

| | | | | |
|---|---|---|---|---|
| 2015/0187636 A1* | 7/2015 | Ho | H01L 21/76251 | 257/774 |
| 2015/0349207 A1* | 12/2015 | Sogo | H01L 33/0093 | 257/99 |
| 2016/0005702 A1* | 1/2016 | Shih | H01L 23/5389 | 257/737 |
| 2016/0005707 A1* | 1/2016 | Kwon | H01L 25/0657 | 257/737 |
| 2016/0118297 A1* | 4/2016 | Chen | H01L 24/03 | 438/127 |
| 2016/0307861 A1* | 10/2016 | Lin | H01L 28/00 | |
| 2016/0307864 A1* | 10/2016 | Chiu | H01L 24/17 | |
| 2016/0351540 A1* | 12/2016 | Ogiso | H01L 23/481 | |
| 2016/0351543 A1* | 12/2016 | Ryu | H01L 25/0657 | |
| 2016/0358900 A1* | 12/2016 | Lai | H01L 21/481 | |
| 2016/0372630 A1* | 12/2016 | Jang | H01L 33/24 | |
| 2016/0379747 A1* | 12/2016 | Wolter | H01L 23/5227 | 336/200 |
| 2016/0379950 A1* | 12/2016 | Tsai | H01L 24/11 | 257/737 |
| 2017/0005035 A1* | 1/2017 | Chen | H01L 23/3171 | |
| 2017/0005052 A1* | 1/2017 | Chen | H01L 21/76885 | |
| 2017/0108173 A1* | 4/2017 | Kim | G06F 1/1662 | |
| 2017/0125346 A1* | 5/2017 | Liu | H01L 23/5386 | |
| 2017/0278814 A1* | 9/2017 | Hung | H01L 24/16 | |
| 2018/0017870 A1* | 1/2018 | Ge | H01L 45/1233 | |
| 2018/0061787 A1* | 3/2018 | Wu | H01L 23/49811 | |
| 2018/0076151 A1* | 3/2018 | Min | H01L 24/03 | |
| 2018/0090460 A1* | 3/2018 | Chu | C23C 14/34 | |
| 2018/0122761 A1* | 5/2018 | Huang | H01L 24/16 | |
| 2018/0151495 A1* | 5/2018 | Hsu | H01L 21/6835 | |
| 2018/0204813 A1* | 7/2018 | Ogumi | H01L 24/94 | |
| 2018/0373079 A1* | 12/2018 | Yeh | H01L 27/124 | |
| 2019/0148343 A1* | 5/2019 | Yu | H01L 24/25 | 257/48 |
| 2019/0164782 A1* | 5/2019 | Shih | H01L 21/4857 | |
| 2020/0013742 A1* | 1/2020 | Chen | H01L 24/19 | |
| 2020/0066582 A1* | 2/2020 | Liao | H01L 21/76837 | |

\* cited by examiner

FIG. 5C

ELECTRONIC COMPONENT INCLUDING A CONDUCTIVE PILLAR AND METHOD OF MANUFACTURING THE SAME

BACKGROUND

1. Technical Field

The present disclosure relates generally to an electronic component and a method of manufacturing the same. More particularly, the present disclosure relates to an electronic component including a conductive pillar and a method of manufacturing the same.

2. Description of the Related Art

In an electrical component, a protective layer is disposed on an active surface of a die, a chip or a wafer, and the protective layer may have multiple openings to expose conductive pads on the active surface of the die for electrical connections. Conductive pillars are disposed on the exposed conductive pads to provide external electrical connections, while dummy conductive pillars are formed on the protective layer to support the die (and also for coplanarity) to avoid die warpage or crack. However, because the dummy conductive pillars are disposed on the protective layer, a top portion of the dummy conductive pillars is higher than that of the conductive pillars, which may result in a disconnection between the conductive pillars and external circuits or a circuit board to be bonded. In addition, because the dummy conductive pillars and the protective layer are formed of different materials, a connection therebetween may be relatively weak.

SUMMARY

In one or more embodiments, an electronic component includes a die, a first protective layer, a second protective layer, a first conductive pillar and a second conductive pillar. The die includes a conductive pad. The first protective layer is disposed on the die. The first protective layer defines a first opening to expose the conductive pad of the die. The second protective layer is disposed on the first protective layer. The second protective layer defines a second opening and a first recess. The second opening exposes the conductive pad of the die. The first conductive pillar is disposed within the second opening and electrically connected to the conductive pad. The second conductive pillar is disposed within the first recess. A height of the first conductive pillar is substantially equal to a height of the second conductive pillar. A bottom surface of the first recess is disposed between a top surface of the first protective layer and a top surface of the second protective layer.

In one or more embodiments, an electronic component includes a die, a first protective layer, a second protective layer, a first conductive pillar and a second conductive pillar. The die includes a conductive pad. The first protective layer is disposed on the die. The first protective layer defines a first opening to expose the conductive pad of the die. The second protective layer is disposed on the first protective layer. The second protective layer defines a second opening penetrating the second protective layer to expose the conductive pad of the die and a first recess partially penetrating the second protective layer. The first conductive pillar is disposed within the second opening and electrically connected to the conductive pad. The second conductive pillar is disposed within the first recess.

In one or more embodiments, an electronic component includes a die, a first protective layer, a second protective layer, a first conductive pillar and a second conductive pillar. The die includes a conductive pad. The first protective layer is disposed on the die. The first protective layer defines a first opening to expose the conductive pad of the die. The second protective layer is disposed on the first protective layer. The second protective layer defines a second opening penetrating the second protective layer to expose the conductive pad of the die and a first recess. The first conductive pillar is disposed within the second opening and electrically connected to the conductive pad. The second conductive pillar is disposed within the first recess. The second protective layer is between the first protective layer and the second conductive pillar. A width of the first recess is less than a width of the second conductive pillar.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Structures, manufacturing and use of the embodiments of the present disclosure are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Embodiments, or examples, illustrated in the drawings are disclosed below using specific language. It will nevertheless be understood that the embodiments or examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

Figure 1:
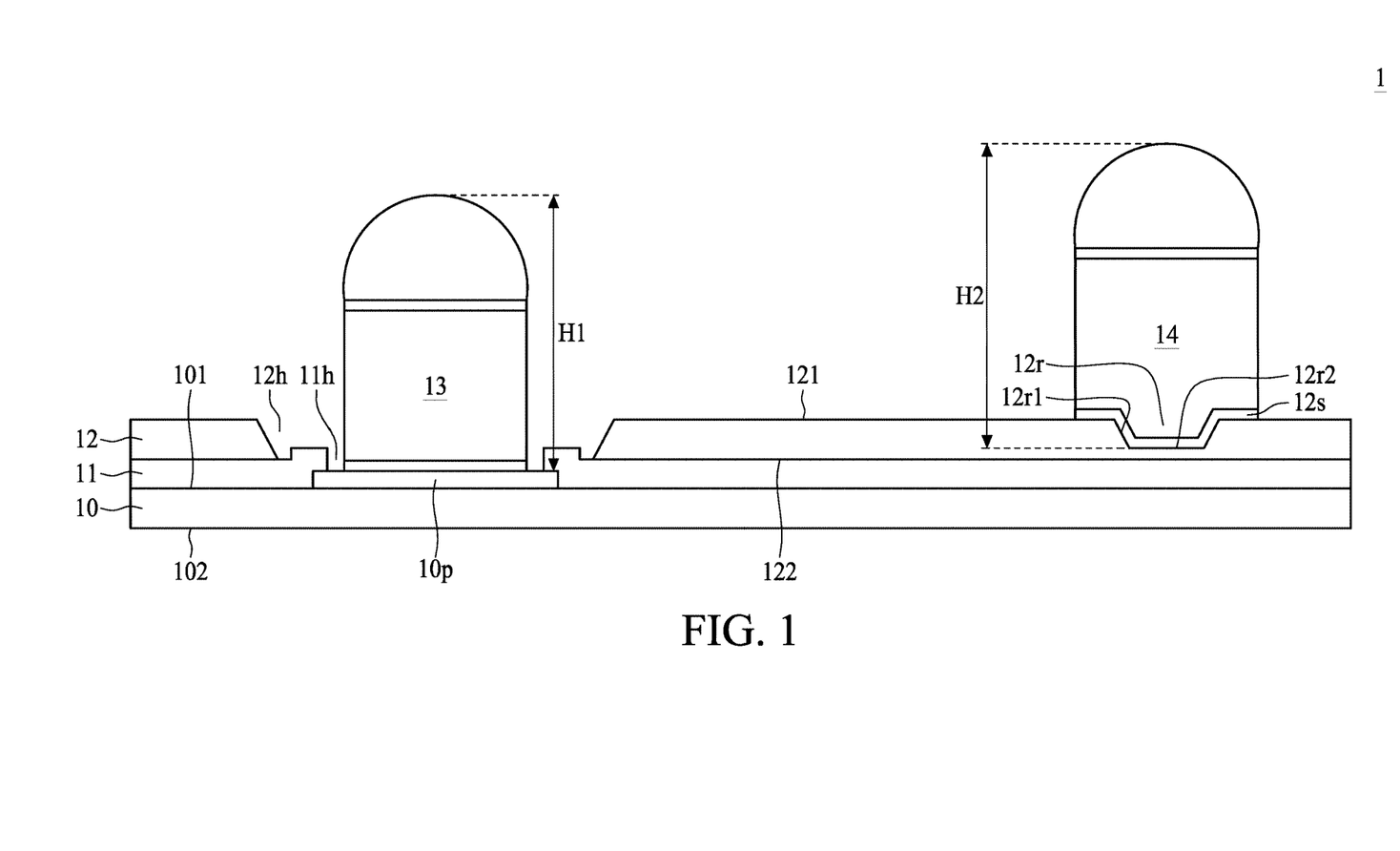
FIG. 1 illustrates a cross-sectional view of an electronic component in accordance with some embodiments of the present disclosure.

FIG. 1 illustrates a cross-sectional view of an electronic component 1 in accordance with some embodiments of the present disclosure. The electronic component 1 includes a die 10 (or a chip), protective layers 11, 12 and conductive pillars 13, 14.

The die 10 has an active surface 101 and a back surface 102 (also referred to as backside) opposite to the active surface 101. The die 10 includes at least one conductive pad 10p on the active surface 101 of the die 10. The die 10 may include a semiconductor substrate, one or more integrated circuit devices and one or more overlying interconnection structures therein. The integrated circuit devices may include active devices such as transistors and/or passive devices such resistors, capacitors, inductors, or a combination of two or more thereof.

The protective layer 11 is disposed on the active surface 101 of the die 10. The protective layer 11 has or defines an opening 11h to expose the conductive pad 10p. In some embodiments, the protective layer 11 may cover a portion (e.g., a peripheral portion) of the conductive pad 10p. Alternatively, the protective layer 11 fully exposes the conductive pad 10p. In some embodiments, the protective layer 11 is a passivation layer including silicon oxide, silicon nitride, gallium oxide, aluminum oxide, scandium oxide, zirconium oxide, lanthanum oxide, hafnium oxide, or another metal or non-metal oxide or nitride. In some embodiments, a thickness the protective layer 11 is in about 1 micrometer (µm) or about 0.5 µm to about 3 µm.

The protective layer 12 is disposed on the protective layer 11. The protective layer 12 has a first surface 121 (or top surface) facing away from the protective layer 11 and a second surface 122 (or bottom surface) opposite to the first surface 121. The protective layer 12 has or defines an opening 12h to expose the opening 11h, the conductive pad 10p and a portion of the protective layer 11. For example, a width of the opening 12h is greater than a width of the opening 11h. The protective layer 12 has or defines a recess 12r on the first surface 121 of the protective layer 12 without fully penetrating (or partially penetrating) the protective layer 12. For example, a bottom surface 12r2 of the recess 12r is positioned at a vertical elevation between a top surface of the protective layer 11 and the first surface 121 of the protective layer 12. For example, a depth of the recess 12r is less than a thickness of the protective layer 12. In some embodiments, the protective layer 12 is a single layer that includes polyimide or other suitable materials (e.g., photosensitive materials). In some embodiments, the thickness of the protective layer 12 is about 5 µm or about 4 µm to about 6 µm. In some embodiments, the depth of the recess 12r is about 3 µm and a distance between the bottom surface 12r2 of the recess 12r and the protective layer 11 is about 2 µm.

The conductive pillar 13 is disposed within the openings 11h, 12h of the protective layers 11, 12 and electrically contacts or connects to the conductive pad 10p on the active surface 101 of the die 10. In some embodiments, a seed layer may be disposed between the conductive pillar 13 and the conductive pad 10p. The seed layer also may be considered to be a part of the conductive pillar 13. In some embodiments, the conductive pillar 13 may include copper. However, other conductive materials such as nickel and/or aluminum or a combination of various metals or other conductive materials may also be used in the conductive pillar 13.

The conductive pillar 14 is disposed on the protective layer 12. A portion of the conductive pillar 14 is within the recess 12r of the protective layer 12 to contact a sidewall 12r1 and the bottom surface 12r2 of the recess 12r. In some embodiments, a width of the conductive pillar 14 is greater than a width of the recess 12r. In some embodiments, a seed layer 12s is disposed on a portion of the protective layer 12, the sidewall 12r1 and the bottom surface 12r2 of the recess 12r. For example, the seed layer 12s is between the conductive pillar 14 and the protective layer 12. The seed layer 12s also may be considered to be a part of the conductive pillar 14. In some embodiments, the conductive pillar 14 may include copper. However, other conductive materials such as nickel and/or aluminum or a combination of various metals or other conductive materials may also be used in the conductive pillar 14. In some embodiments, the conductive pillar 14 serves as a dummy conductive pillar to provide a support for the electronic component 1 rather than provide electrical connections for the die 10.

In some embodiments, a height H1 of the conductive pillar 13 is substantially equal to a height H2 of the conductive pillar 14. Since the conductive pillar 13 is disposed on the conductive pad 10p while the conductive pillar 14 is disposed on the protective layer 12 and within the recess 12r, a top portion of the conductive pillar 14 may be higher than a top portion of the conductive pillar 13.

In a comparative electronic component, a conductive pillar for electrical connections is disposed on a conductive pad of a die and a dummy conductive pillar is directly disposed on a protective layer. However, due to a height difference between the conductive pad and the protective layer, a top portion of the dummy conductive pillar is higher than that of the conductive pillar, which may result in a disconnection between the conductive pillar and external circuits or a circuit board to be bonded. In addition, because the dummy conductive pillar and the protective layer are formed of different materials, the connection therebetween is relatively weak. In the embodiments shown in FIG. 1 of the present disclosure, by forming the recess 12r in the protective layer 12 without fully penetrating the protective layer 12 and disposing the dummy conductive pillar 14 within the recess 12r, the non-coplanarity between the top portion of the dummy conductive pillar 14 and the conductive pillar 13 for electrical connection can be improved. In addition, forming the dummy conductive pillar 14 within the recess 12r can enhance the bonding force between the dummy conductive pillar 14 and the protective layer 12.

Figure 2:
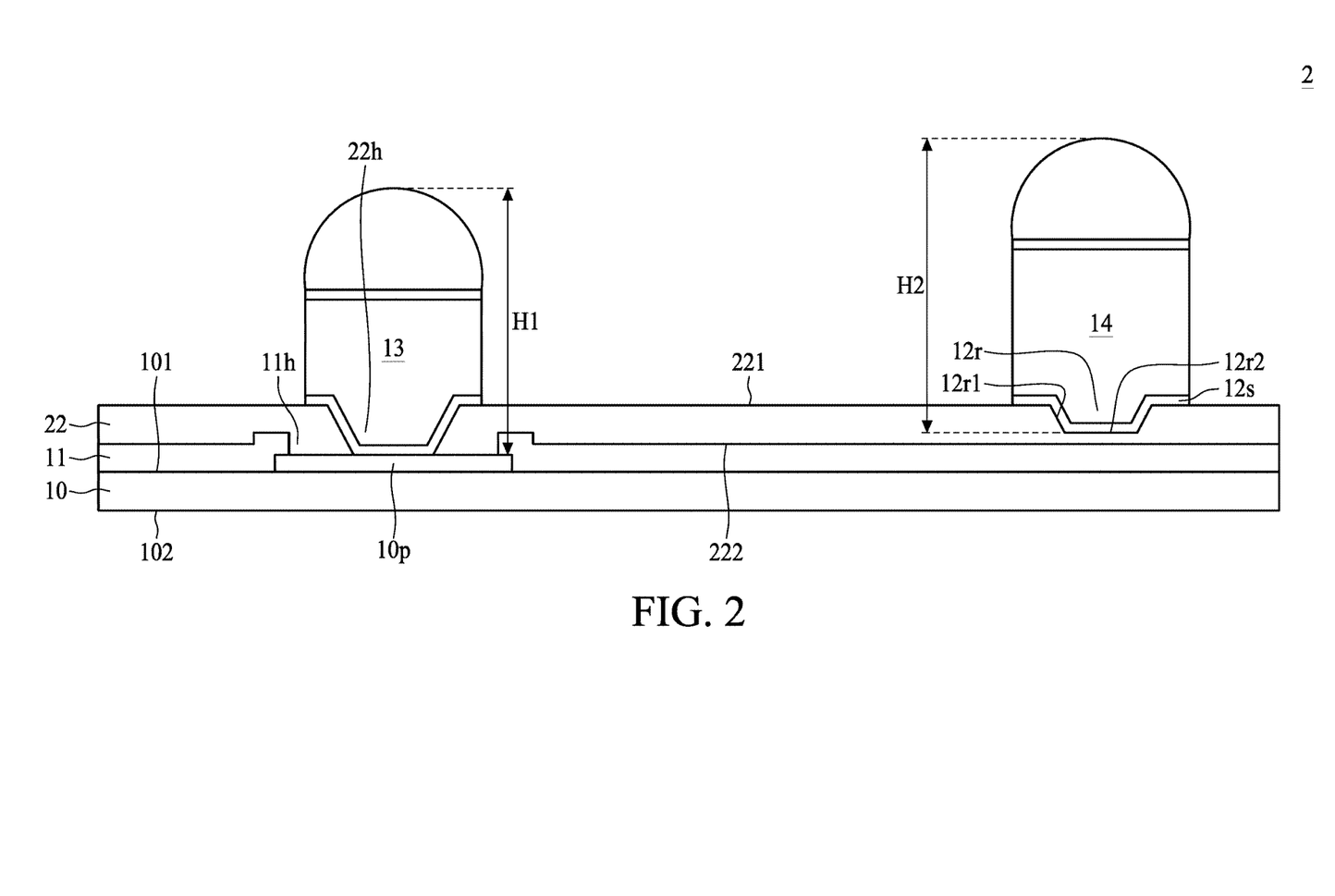
FIG. 2 illustrates a cross-sectional view of an electronic component in accordance with some embodiments of the present disclosure.

FIG. 2 illustrates a cross-sectional view of an electronic component 2 in accordance with some embodiments of the present disclosure. The electronic component 2 is similar to the electronic component 1 in FIG. 1 except that in FIG. 2, a width of an opening 22h of a protective layer 22 is less than the width of the opening 11h of the protective layer 11, while in FIG. 1, the width of the opening 12h of the protective layer 12 is greater than the width of the opening 11h of the protective layer 11.

Referring to FIG. 2, the protective layer 22 is disposed on the protective layer 11 and extends into the opening 11h of the protective layer 11 to cover a portion of the conductive pad 10p. The conductive pillar 13 is disposed on the protective layer 22 and within the opening 22h of the protective layer 22 to electrically contact or connect to the conductive pad 10p.

Figure 3:
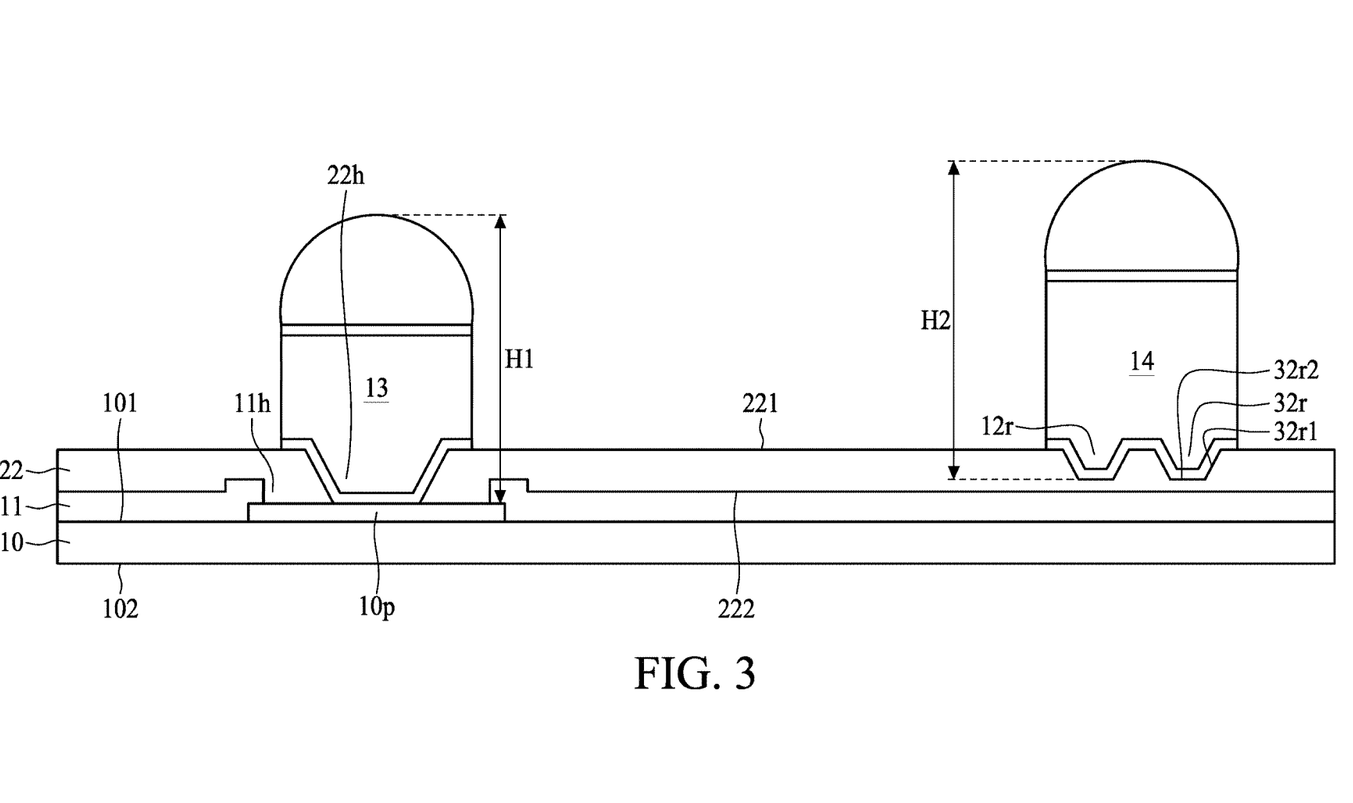
FIG. 3 illustrates a cross-sectional view of an electronic component in accordance with some embodiments of the present disclosure.

FIG. 3 illustrates a cross-sectional view of an electronic component 3 in accordance with some embodiments of the present disclosure. The electronic component 3 is similar to the electronic component 2 in FIG. 2 except that in FIG. 3, the protective layer 22 defines multiple recesses 12r and 32r.

In addition to the recess 12r as shown in FIG. 2, the protective layer 22 further defines the recess 32r on a first surface 221 of the protective layer 22 without fully penetrating the protective layer 22. The recess 32r is adjacent to the recess 12r and spaced apart from the recess 12r. A bottom surface 32r2 of the recess 32r is between the top surface of the protective layer 11 and the first surface 221 of the protective layer 22. For example, a depth of the recess 32r is less than a thickness of the protective layer 22. In some embodiments, the depth of the recess 32r is about 3 µm and a distance between the bottom surface 32r2 of the recess 32r and the protective layer 11 is about 2 µm.

A portion of the conductive pillar 14 is within the recesses 12r and 32r of the protective layer 12 to contact the sidewalls 12r1, 32r1 and the bottom surfaces 12r2, 32r2 of the recesses 12r and 32r. In some embodiments, a width of the conductive pillar 14 is greater than a sum of a width of the recess 12r and a width of the recess 32r. In some embodiments, the number of the recesses can be selected depending on design specifications. Increasing the number of the recesses can enhance the bonding force between the dummy conductive pillar 14 and the protective layer 12.

Figure 4:
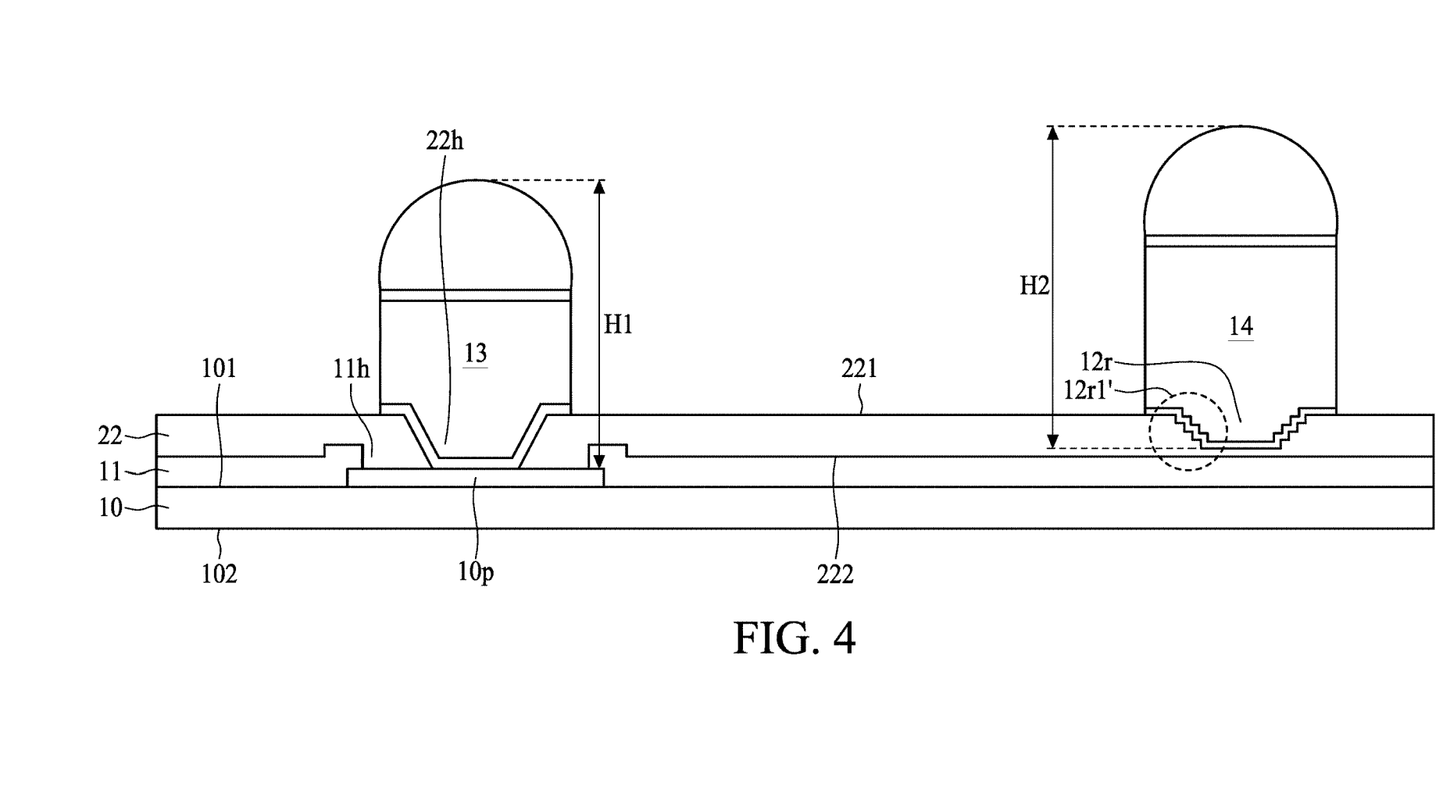
FIG. 4 illustrates a cross-sectional view of an electronic component in accordance with some embodiments of the present disclosure.

FIG. 4 illustrates a cross-sectional view of an electronic component 4 in accordance with some embodiments of the present disclosure. The electronic component 4 is similar to the electronic component 2 in FIG. 2 except that in FIG. 4, the recess 12r has a stepped sidewall 12r1'. The stepped sidewall 12r1' of the recess 12r can enhance the bonding force between the dummy conductive pillar 14 and the protective layer 22.

Figure 5A:
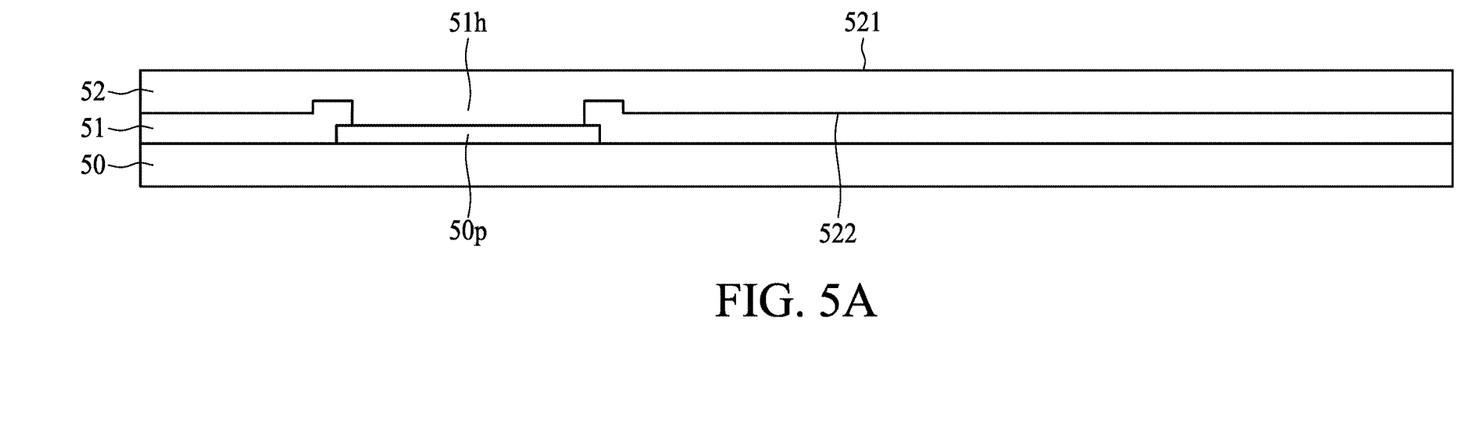
FIG. 5A, FIG. 5B, and FIG. 5C illustrate various stages of a method of manufacturing an electronic component in accordance with some embodiments of the present disclosure.
Figure 5B:
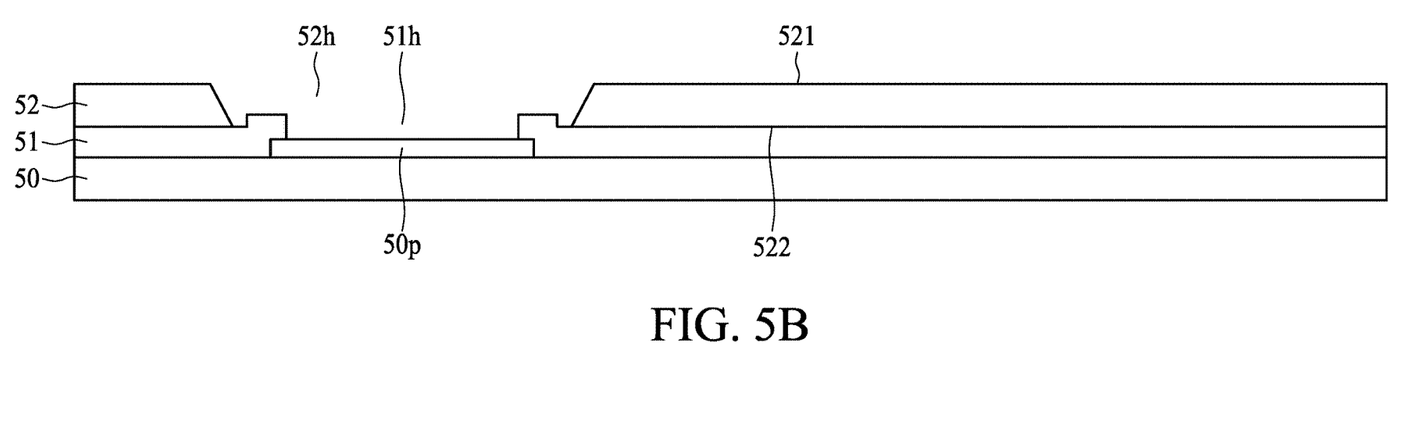
Figure 5C:
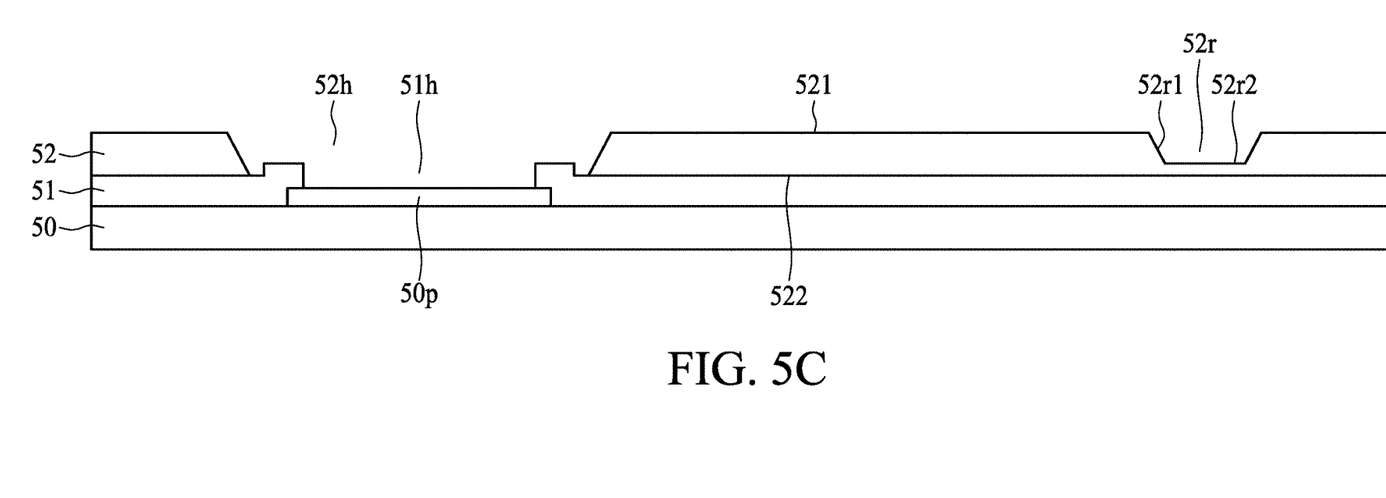

FIG. 5A, FIG. 5B and FIG. 5C are cross-sectional views of a semiconductor structure fabricated at various stages, in accordance with some embodiments of the present disclosure. Various drawings have been simplified for a better understanding of the aspects of the present disclosure.

Referring to FIG. 5A, a die strip (e.g., a wafer) of multiple dies 50 including a die 50 is provided. The die 50 includes at least one conductive pad 50p on an active surface of the die 50. Each die 50 may include a semiconductor substrate, one or more integrated circuit devices and one or more overlying interconnection structures therein. The integrated circuit devices may include one or more active devices such as transistors and/or passive devices such resistors, capacitors, inductors or a combination of two or more thereof.

A protective layer 51 is disposed or formed on the die 50. The protective layer 51 has or defines an opening 51h to expose the conductive pad 50p. In some embodiments, the protective layer 51 may cover a portion of the conductive pad 50p. Alternatively, the protective layer 51 fully exposes the conductive pad 50p. In some embodiments, the opening 51h can be formed by, e.g., routing, etching or other suitable processes. In some embodiments, the protective layer 51 is a passivation layer including silicon oxide, silicon nitride, gallium oxide, aluminum oxide, scandium oxide, zirconium oxide, lanthanum oxide, hafnium oxide, or another metal or non-metal oxide or nitride. In some embodiments, a thickness the protective layer 51 is in about 1 µm.

A protective layer 52 is disposed or formed on the protective layer 51. The protective layer 52 has a first surface 521 (or top surface) facing away from the protective layer 51 and a second surface 522 (or bottom surface) opposite to the first surface 521. In some embodiments, the protective layer 52 includes polyimide or other suitable materials (e.g., photosensitive materials). In some embodiments, a thickness of the protective layer 52 is about 5 µm.

Referring to FIG. 5B, an opening 52h is formed to fully penetrate the protective layer 52 to expose the conductive pad 50p, the opening 51h and a portion of the protective layer 51. As shown in FIG. 5B, a width of the opening 52h is greater than a width of the opening 51h. Alternatively, the width of the opening 52h may be less than or substantially equal to the width of the opening 51h depending on design specifications. In some embodiments, the opening 52h can be formed by photolithography, chemical etching, laser drilling, or other suitable processes.

Referring to FIG. 5C, a recess 52r is formed on the first surface 521 of the protective layer 52 without fully penetrating the protective layer 52. For example, a bottom surface 52r2 of the recess 52r is between a top surface of the protective layer 51 and the first surface 521 of the protective layer 52. For example, a depth of the recess 52r is less than a thickness of the protective layer 52. In some embodiments, the depth of the recess 52r is about 3 µm and a distance between the bottom surface 52r2 of the recess 52r and the protective layer 51 is about 2 µm. In some embodiments, the recess 52r can be formed by photolithography, chemical etching, laser drilling, or other suitable processes. In some embodiments, more than one recess can be formed depending on design specifications. In some embodiments, a sidewall 52r1 of the recess can be planar or a stepped structure depending on design specifications.

In some embodiments, a conductive pillar can be formed within the opening 52h to electrically contact or connect to the conductive pad 50p and a conductive pillar can be formed within the recess 52r to form the electronic component 1 as shown in FIG. 1. In some embodiments, the conductive pillars may be formed by, e.g., electroplating or other suitable techniques.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic component, comprising: a die including a conductive pad; a first protective layer disposed on the die, the first protective layer defining a first opening to expose the conductive pad of the die; a second protective layer disposed on the first protective layer, the second protective layer defining a second opening and a first recess, the second opening exposing the conductive pad of the die; a first conductive pillar disposed within the second opening and electrically connected to the conductive pad; and a second conductive pillar disposed within the first recess, wherein a height of the first conductive pillar is substantially equal to a height of the second conductive pillar, wherein a depth of the first recess is less than a thickness of the second protective layer and the second conductive pillar directly contacts the second protective layer through a seed layer on a bottom surface of the first recess and sidewalls of the first recess, and a width of the first opening is less than a width of the second opening.

2. The electronic component of claim 1, wherein a width of the first recess is less than a width of the second conductive pillar.

3. The electronic component of claim 1, wherein the second protective layer has the top surface facing away from the first protective layer and a bottom surface opposite to the top surface of the second protective layer; and the first recess has the bottom surface and the sidewalls extending between the bottom surface of the first recess and the top surface of the second protective layer.

4. The electronic component of claim 3, wherein the second conductive pillar is also disposed on the top surface of the second protective layer.

5. The electronic component of claim 4, further comprising the seed layer between the second conductive pillar and the top surface of the second protective layer.

6. An electronic component, comprising: a die including a conductive pad; a first protective layer disposed on the die, the first protective layer defining a first opening to expose the conductive pad of the die; a second protective layer disposed on the first protective layer, the second protective layer defining a second opening penetrating the second protective layer to expose the conductive pad of the die, and defining a first recess; a first conductive pillar disposed within the second opening and electrically connected to the conductive pad; and a second conductive pillar disposed within the first recess, wherein the second protective layer is between the first protective layer and the second conductive pillar, and a width of the first recess is less than a width of the second conductive pillar, and the second protective layer is a single layer; and the first pillar is detached from the first and second protective layers, wherein the second protective layer is inclined and laterally recessed in relation to the first protective layer where the first opening is defined, and the gap between the first pillar and the second protective layer defining the second opening is larger than the gap between the first pillar and the first protective layer defining the first opening.

7. The electronic component of claim 6, wherein a depth of the first recess is less than a thickness of the second protective layer.

8. The electronic component of claim 6, wherein
the second protective layer has a first surface facing away from the first protective layer and a second surface opposite to the first surface; and
the first recess has a bottom surface and a sidewall extending between the bottom surface of the first recess and the first surface of the second protective layer.

9. The electronic component of claim 8, wherein the second conductive pillar is disposed on the first surface of the second protective layer, the bottom surface of the first recess, and the sidewall of the first recess.

10. The electronic component of claim 9, further comprising a seed layer between the second conductive pillar and the first surface of the second protective layer, the bottom surface of the first recess, and the sidewall of the first recess.

11. The electronic component of claim 6, wherein a height of the first conductive pillar is substantially equal to a height of the second conductive pillar.

* * * * *